United States Patent [19]
Ryuo et al.

[11] Patent Number: 4,968,954
[45] Date of Patent: Nov. 6, 1990

[54] EPITAXIAL LAYER-BEARING WAFER OF RARE EARTH GALLIUM GARNET FOR MSW DEVICE

[75] Inventors: Toshihiko Ryuo; Satoru Fukuda; Tatsuo Mori; Masayuki Tanno, all of Gunma, Japan

[73] Assignee: Shin-Etsu Chemical Co., Ltd., Tokyo, Japan

[21] Appl. No.: 353,796

[22] Filed: May 18, 1989

[30] Foreign Application Priority Data

Sep. 30, 1988 [JP] Japan .................................. 63-246831

[51] Int. Cl.$^5$ .................. H03B 5/00; H03H 9/64; B32B 9/00
[52] U.S. Cl. ................. 331/107 A; 333/193; 428/693
[58] Field of Search .................. 331/107 A; 333/193; 428/692, 693, 700

[56] References Cited

U.S. PATENT DOCUMENTS 4,624,901 11/1986 Glass .................. 428/700 X

Primary Examiner—David Mis
Attorney, Agent, or Firm—McAulay Fisher Nissen & Goldberg

[57] ABSTRACT

An improved epitaxial single crystal wafer suitable as a working element of magnetostatic wave devices is proposed which comprises a substrate single crystal wafer of a rare earth gallium garnet, e.g., gadolinium gallium garnet, neodymium gallium garnet and samarium gallium garnet, and an epitaxial layer formed thereon having a chemical composition, different from conventional yttrium iron garnet, $Y_3Fe_5O_{12}$, of the formula $$(Y_{1-x}M_x)_a Fe_{8-a}O_{12} \text{ or}$$
$$(Y_{1-x}M_x)_a (Fe_{1-y}Q_y)_{8-a}O_{12},$$

in which M is an element selected from the group consisting of bismuth, lanthanum, gadolinium and lutetium, the subscript a is a positive number in the range from 3.0 to 3.1, the subscript x is a positive number in the range from 0.01 to 0.9, Q is an element selected from the group consisting of aluminum, gallium, indium and scandium and the subscript y is a positive number in the range from 0.1 to 0.2. These epitaxial wafers are advantageous in respect of the greatly decreased problem of mismatching in the lattice constants between the substrate and the epitaxial layer.

20 Claims, 3 Drawing Sheets

EPITAXIAL LAYER-BEARING WAFER OF RARE EARTH GALLIUM GARNET FOR MSW DEVICE

BACKGROUND OF THE INVENTION

The present invention relates to a single crystal wafer of rare earth gallium garnet bearing an epitaxially grown magnetic layer thereon. More particularly, the invention relates to a so-called epitaxial single crystal wafer of rare earth gallium garnet suitable as an element of a MSW (magnetostatic wave) device such as MSW filters, oscillators, isolators, circulators and the like.

It is an established technology in the field of microwave engineering to use a single crystal of YIG (yttrium iron garnet) grown by the flux method as a magnetic material for microwave devices. Such a microwave device manufactured by using a YIG single crystal grown by the flux method, however, is disadvantageous due to expensiveness of the single crystal as a consequence of the low productivity in the process of single crystal growing. Accordingly, it is proposed to use a so-called epitaxial YIG single crystal grown on a suitable substrate single crystal wafer of, for example, GGG (gadolinium gallium garnet) by the method of liquid-phase epitaxy (LPE) utilizing the stockpile of technology obtained in the manufacture of bubble memory devices.

Various kinds of rare earth gallium garnets, generally referred to as the RGG hereinbelow, are proposed for a single crystal material used as a substrate wafer on which the epitaxial layer of YIG is grown in the above mentioned LPE method. One of the important problems involved in these RGG single crystals as a substrate for YIG epitaxy is that no good matching can be obtained in the lattice constants between the substrate RGG and the epitaxial YIG. Namely, while single crystals of YIG have a lattice constant of 1.2376 nm, all of the hitherto proposed RGG single crystals have a significantly different lattice constant including 1.2383 nm in GGG, 1.245 nm or 1.2946 nm in GGG partly substituted with calcium, magnesium or zirconium, 1.2438 nm in SGG (samarium gallium garnet), 1.2508 nm in NGG (neodymium gallium garnet) and so on. Mismatching in the lattice constants between the substrate and the epitaxial layer naturally causes a large stress in the epitaxial layer which may eventually lead to cracking of the epitaxial layer. It is eagerly desired therefore to develop an inexpensive and reliable epitaxial single crystal wafer of RGG suitable as a microwave device or, in particular, MSW device.

SUMMARY OF THE INVENTION

The present invention, which has been completed as a result of the extensive investigations to satisfy the above mentioned requirement, provides an epitaxial single crystal wafer which comprises:

(a) a single crystal wafer of a rare earth gallium garnet, which is preferably GGG, NGG or SGG unsubstituted or partially substituted with calcium, magnesium or zirconium, as a substrate; and (b) a layer of a magnetic single crystal having a thickness of at least 10 μm epitaxially grown on at least one surface of the substrate wafer and represented by the chemical formula $$(Y_{1-x}M_x)_a Fe_{8-a} O_{12}, \qquad (I)$$

in which M is an element selected from the group consisting of bismuth, lanthanum, gadolinium and lutetium or, preferably, bismuth, the subscript a is a positive number in the range from 3.0 to 3.1 and the subscript x is a positive number in the range from 0.01 to 0.9.

Alternatively, the epitaxially grown magnetic single crystal layer has a composition expressed by the chemical formula $$(Y_{1-x}M_x)_a(Fe_{1-y}Q_y)_{8-a}O_{12}, \qquad (II)$$

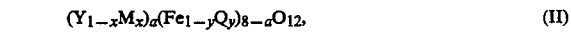

in which M, a and x each have the same meaning as defined above, Q is an element selected from the group consisting of aluminum, gallium, indium and scandium and the subscript y is a positive number in the range from 0.01 to 0.2.

DETAILED DESCRIPTION OF THE PREFERRED EMBODIMENTS

Figure 1A:
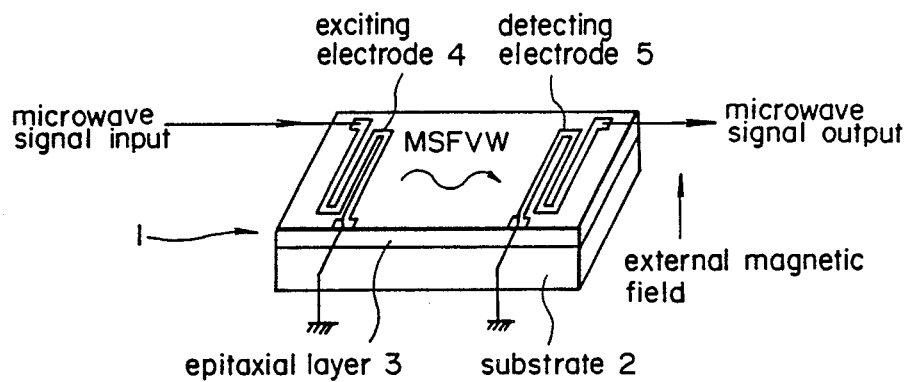
FIG. 1a is a partial perspective view of a high-frequency tunable filter comprising a microwave device of the invention and FIG. 1b is a schematic illustration of an assembly of the high-frequency tunable filter of FIG. 1a held in a magnetic field.

As is described above, the inventive epitaxial wafer comprises a substrate wafer of a RGG and a magnetic layer having a thickness of at least 10 μm epitaxially grown thereon and having a chemical composition expressed by the above given formula (I) or (II). When the epitaxial layer has this chemical composition, a complete solution can be obtained for the problem of mismatching in the lattice constants between the substrate wafer and the epitaxial layer formed thereon by satisfying the requirement that the difference in the lattice constants should not exceed ±0.0003 nm to prevent formation of cracks and pits in the epitaxial layer. Namely, substitution of the substituent element, viz. bismuth, lanthanum, gadolinium or lutetium, of which the ion radius differs from that of yttrium and which also have no effect of broadening of the peak width in the microwave absorption spectrum, for a part of the yttrium atoms occupying mainly the C-sites has an effect of modifying the lattice constant of the epitaxial layer when the chemical composition can be given by the formula (I). Further, similar effects of modifying the lattice constant of the epitaxial layer can be obtained by the additional substitution of aluminum, gallium, indium or scandium for a part of the iron atoms to give a chemical composition of the epitaxial layer expressed by the formula (II).

The material of the substrate wafer in the inventive epitaxial wafer is a RGG including GGG having a lattice constant of 1.2383 nm, SGG having a lattice constant of 1.2438 nm and NGG having a lattice constant of 1.2508 nm as well as a GGG partially substituted with calcium and zirconium to have a lattice constant of 1.245 nm and with calcium, zirconium and magnesium to have a lattice constant of 1.2496 nm (SOG and NOG, respectively, each a commerical name of a product by Shin-Etsu Chemical Co.). The SOG single crystals are expressed by the formula $Gd_ACa_BGa_CZr_BO_{12}$, in which the subscript A is a positive number in the range from 2.60 to 2.80, the subscript B is a positive number in the range from 0.22 to 0.42 and the subscript C is a positive number in the range from 4.56 to 4.76 with the proviso that $A+2B+C=8.0$. The NOG single crystals are expressed by the formula $Gd_ECa_FGa_GMg_HZr_IO_{12}$, in which the subscript E is a positive number in the range from 2.60 to 2.80, the subscript F is a positive number in the range from 0.25 to 0.45, the subscript G is a positive number in the range from 3.90 to 4.10, the subscript H is a positive number in the range from 0.20 to 0.40 and the subscript I is a positive number in the range from 0.55 to 0.75 with the proviso that $E+F+G+H+I=8.0$ and $F+H=I$. Single crystals of these RGGs can be grown by the so-called Czochralski method in which an iridium crucible is charged with each a calculated amount of a rare earth oxide, e.g., $Gd_2O_3$, $Sm_2O_3$ or $Nd_2O_3$, and gallium oxide $Ga_2O_3$ optionally together with oxides of the substituent elements, e.g., CaO, MgO and/or $ZrO_2$, and the oxide mixture is melted by high-frequency heating into a melt from which a single crystal is grown by pulling up on a seed crystal. The thus grown single crystal is sliced in a plane perpendicular to the growing axis of the single crystal boule into wafers which are then lapped and etched with, for example, hot phosphoric acid. The lattice constant of these substrate wafers can be determined by the X-ray diffractometry and found to be in the range from 1.2383 nm to 1.2508 nm as is mentioned above.

The material of the epitaxial layer formed on the above mentioned substrate wafer is a YIG with replacement of a part of the yttrium atoms occupying mainly the C-sites with a yttrium-substituting element denoted by M and selected from the group consisting of bismuth, lanthanum, gadolinium and lutetium having an ion radius different from that of yttrium in a specific proportion or degree of substitution defined by the subscript x in the formula (I). The material of the epitaxial layer may further by a YIG with replacement of, in addition to the above mentioned replacement of a part of the yttrium atoms with bismuth, lanthanum, gadolinium and/or lutetium, the iron atoms with an iron-substituting element denoted by Q selected from the group consisting of aluminum, gallium, indium and scandium in a specific proportion or degree of substitution defined by the subscript y in the formula (II). Substitution of the above mentioned substituting elements for the yttrium and iron atoms does not have an effect of broadening the peak width in the microwave absorption spectrum. When the degree of substitution with these substituent elements is appropriately controlled, it is possible that the difference in the lattice constants between the substrate single crystal and the epitaxial layer is as small as $\pm 0.0003$ nm to $\pm 0.0005$ nm or even smaller to be absolutely freed from the problem of mismatching in the lattice constants as well as the danger of occurence of cracks and pits in the epitaxial layer even when the epitaxial layer has a thickness of 10 $\mu$m or larger consequently giving excellent microwave devices.

The growth of the epitaxial layer expressed by the formula (I) or (II) can be effected by a known LPE method according to the well known procedure. Namely, yttrium oxide $Y_2O_3$, iron oxide $Fe_2O_3$ and oxide or oxides of the substituting elements are taken in a platinum crucible each in a calculated and weighted amount together with lead oxide PbO and boron oxide $B_2O_3$ as the flux-forming constituents and the oxide mixture is melted in the flux by heating at a temperature of 1050° to 1150° C. to form a melt. Thereafter, the temperature of the melt is decreased to 750° to 950° C. and a substrate wafer is dipped therein and pulled up therefrom so as to grow the epitaxial layer on the surface. The lattice constant of the epitaxial layer can be controlled by modifying the formulation of the oxide mixture. In this regard, it is advisable to undertake a preliminary test that the oxide melt in the flux formed at 1050° to 1150° C. is gradually cooled so as to precipitate a single crystal having a formula of (I) or (II) of which the lattice constant is determined to confirm satisfactory matching with that of the substrate wafer.

In the following, several examples are given of the composition of the formula (I) or (II) of the epitaxial layers having a lattice constant of which the difference from that of the substrate is within $\pm 0.0003$ nm to $\pm 0.0005$ nm for each type of the substrate single crystals.

GGG (lattice constant 1.2383 nm)

$(Y_{0.98}La_{0.02})_{3.03}Fe_{4.97}O_{12}$ $(Y_{0.97}Bi_{0.03})_{3.03}Fe_{4.97}O_{12}$ $(Y_{0.91}Gd_{0.09})_{3.04}Fe_{4.96}O_{12}$ $(Y_{0.91}Bi_{0.03}Lu_{0.04})_{3.05}Fe_{4.95}O_{12}$ $(Y_{0.75}Bi_{0.08}Lu_{0.17})_{3.05}Fe_{4.97}O_{12}$

NGG (lattice constant 1.2508 nm)

$(Y_{0.63}La_{0.37})_{3.02}Fe_{4.98}O_{12}$ $(Y_{0.44}Bi_{0.56})_{3.02}Fe_{4.98}O_{12}$ $(Y_{0.26}Gd_{0.30}Bi_{0.44})_{3.03}Fe_{4.97}O_{12}$

SGG (lattice constant 1.2438 nm)

$(Y_{0.84}La_{0.16})_{3.04}Fe_{4.96}O_{12}$ $(Y_{0.74}Bi_{0.26})_{3.04}Fe_{4.96}O_{12}$ $(Y_{0.40}Gd_{0.60})_{3.03}Fe_{4.97}O_{12}$ $(Y_{0.25}Bi_{0.40}Lu_{0.35})_{3.04}Fe_{4.96}O_{12}$ $Gd_{2.70}Ca_{0.32}Ga_{4.66}Zr_{0.32}O_{12}$ (lattice constant 1.245 nm)

$(Y_{0.79}La_{0.21})_{3.04}Fe_{4.96}O_{12}$ $(Y_{0.68}Bi_{0.32})_{3.04}Fe_{4.96}O_{12}$ $(Y_{0.18}Gd_{0.82})_{3.03}Fe_{4.97}O_{12}$ $(Y_{0.39}Bi_{0.40}Lu_{0.21})_{3.03}Fe_{4.97}O_{12}$ $Gd_{2.70}Ca_{0.35}Ga_{4.00}Mg_{0.30}Zr_{0.65}O_{12}$ (lattice constant 1.2496 nm)

$(Y_{0.66}La_{0.34})_{3.02}Fe_{4.98}O_{12}$ $(Y_{0.49}Bi_{0.51})_{3.02}Fe_{4.98}O_{12}$ $(Y_{0.31}Gd_{0.30}Bi_{0.39})_{3.03}Fe_{4.97}O_{12}$

GGG (lattice constant 1.2383 nm)

$(Y_{0.90}La_{0.10})_{3.03}(Fe_{0.85}Al_{0.15})_{4.97}O_{12}$ $(Y_{0.96}La_{0.04})_{3.04}(Fe_{0.83}Ga_{0.17})_{4.96}O_{12}$ $(Y_{0.84}Bi_{0.16})_{3.03}(Fe_{0.84}Al_{0.16})_{4.97}O_{12}$ $(Y_{0.93}La_{0.07})_{3.04}(Fe_{0.82}Ga_{0.18})_{4.96}O_{12}$ $(Y_{0.83}Gd_{0.17})_{3.04}(Fe_{0.84}Ga_{0.16})_{4.96}O_{12}$

Figure 1B:
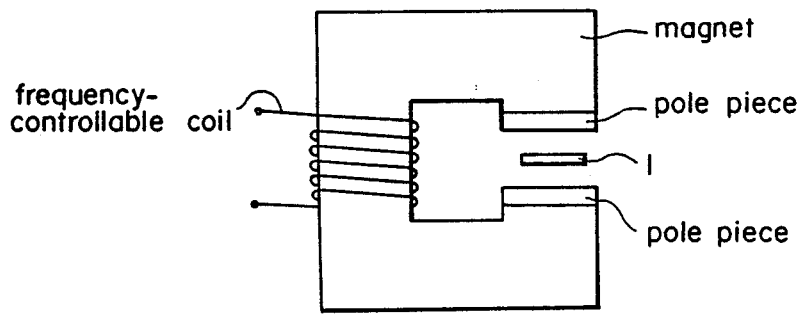
Figure 3:
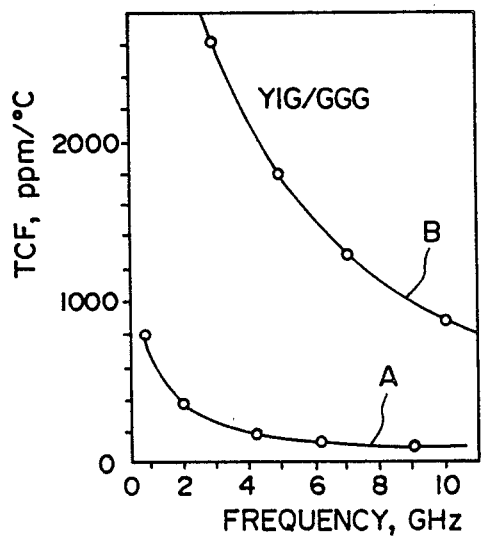

The epitaxial wafer prepared in the above described manner is used as an element of a microwave device or, for example, a MSW device illustrated in FIG. 1a. The epitaxial wafer 1 in a rectangular form formed of a substrate wafer 2 and an epitaxial layer 3 is provided with an MSW exciting electrode 4 and an MSW detecting electrode 5 each made of aluminum on the surface of the magnetic epitaxial layer 3 by the method of photolithography. This device is placed in an external magnetic field as is shown in FIG. 1b in such a disposition that the magnetic field is perpendicular to the surface of the magnetic epitaxial layer 3 to serve as an MSW tunable filter to which MSW signals are applied to determine the temperature dependency coefficient (TCF) of the center frequency. The inventive epitaxial wafer is outstandingly advantageous in respect of the small TCF in a frequency range of 0.3 to 10 GHz as compared with conventional GGG-based YIG epitaxial wafers. FIG. 3 is a graph showing the TCF of the inventive epitaxial wafer (curve A) and a conventional YIG/GGG epitaxial wafer (curve B).

Figure 4:
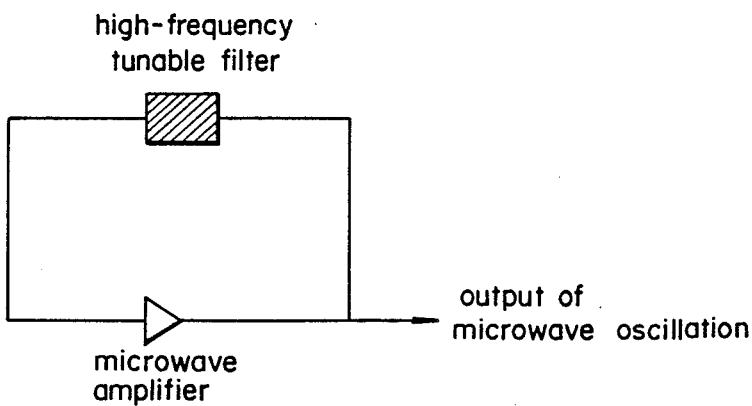
FIG. 4 is a block diagram of a high-frequency tunable oscillator using the inventive high-frequency tunable filter and FIG. 5 is an oscillation spectrum of the same.

Further, the MSW tunable filter constructed as shown in FIGS. 1a and 1b is used as a unit in a MSW oscillator by connecting in series with an amplifier A as is shown by the block diagram in FIG. 4. This MSW oscillator is very advantageous in respect of the small TCF of the oscillation spectrum which can be determined by applying microwave signals to the circuit at varied temperatures as compared with a similar MSW oscillator constructed by using a conventional YIG/GGG epitaxial wafer in the frequency range of 0.3 to 10 GHz.

As is understood from the above given description, the epitaxial wafer of the invention can be used as an MSW device in filters, isolators, circulators, oscillators and the like working in the frequency range of 0.1 GHz to 30 GHz advantageously with an outstandingly small TCF as compared with conventional MSW devices.

In the following, Examples are given to illustrate the invention in more detail. In the Examples, the microwave absorption spectrum was determiend in the following manner. Thus, a piece of 2.6 mm by 2.6 mm square was taken by cutting the epitaxial wafer and a ferromagnetic resonance apparatus was constructed using the same in which the microwave absorption spectrum was measured to give the half-value width ΔH of the peak. The lattice constant of an epitaxial layer was determined by the X-ray diffractometry.

EXAMPLE 1.

A platinum crucible was charged with a mixture of 29 g of yttrium oxide $Y_2O_3$, 512 g of iron oxide $Fe_2O_3$, 575 g of bismuth oxide $Bi_2O_3$, 4790 g of lead oxide PbO and 96 g of boron oxide $B_2O_3$ and the mixture was melted by heating at 1100° C. A single crystal wafer of GGG having a thickness of 500 μm was dipped in the melt kept at a temperature of 905° C. and an epitaxial layer was grown on the substrate surface in the crystallographic orientation of <111> until a thickness of 50 μm was obtained taking 1.4 hours.

The thus formed epitaxial layer had a chemical composition expressed by the formula $(Y_{0.97}Bi_{0.03})_{3.03}Fe_{4.97}O_{12}$ and the lattice constant thereof was 1.2385 nm to be approximately identical with that of the GGG substrate wafer. The surface of the thus formed epitaxial layer was examined with an optical microscope to find substantially no cracks and fissures. The half-value width ΔH of the peak in the microwave absorption spectrum was 0.6 Oe as determined in the above described manner.

EXAMPLE 2.

The experimental procedure using a single crystal wafer of GGG was substantially the same as in Example 1 excepting modification of the formulation of the oxide combination melted in the flux of boron oxide and lead oxide. Four epitaxial wafers having epitaxial layers of different compositions were prepared in this manner. All of the epitaxial wafers each had a 50 μm thick epitaxial layer and were quite satisfactory in appearance without cracks and fissures. The chemical compositions and lattice constant of these epitaxial layers were as shown below. The lattice constants were approximately in coincidence with that of GGG within ±0.0003 nm of deviation.

$(Y_{0.98}La_{0.02})_{3.03}Fe_{4.97}O_{12}$: lattice constant 1.2385 nm $(Y_{0.91}Gd_{0.09})_{3.04}Fe_{4.96}O_{12}$: lattice constant 1.2384 nm $(Y_{0.91}Bi_{0.03}Lu_{0.04})_{3.05}Fe_{4.96}O_{12}$: lattice constant 1.2385 nm $(Y_{0.75}Bi_{0.08}Lu_{0.17})_{3.05}Fe_{4.95}O_{12}$: lattice constant 1.2384 nm The half-value width ΔH of the peak in the microwave absorption spectrum of each of these epitaxial wafers was smaller than 1.0 Oe as determined in the above described manner.

EXAMPLE 3.

The experimental procedure was substantially the same as in Example 1 excepting the use of a single crystal wafer of SGG as the substrate and modification of the formulation of the oxide combination melted in the flux of boron oxide and lead oxide so as to obtain an epitaxial layer of the chemical composition of the formula $(Y_{0.74}Bi_{0.26})_{3.04}Fe_{4.96}O_{12}$. The thus formed epitaxial layer had a thickness of 50 μm and was quite satisfactory in appearance. The lattice constant thereof was 1.2438 nm in approximate coincidence with that of the substrate SGG.

The half-value width ΔH of the peak in the microwave absorption spectrum of this epitaxial wafer was 1.1 Oe as determined in the above described manner.

EXAMPLE 4.

The experimental procedure was substantially the same as in Example 1 excepting the use of a single crystal wafer of NGG as the substrate and modification of the formulation of the oxide combination melted in the flux of boron oxide and lead oxide so as to obtain an epitaxial layer of the chemical composition of the formula $(Y_{0.44}Bi_{0.56})_{3.02}Fe_{4.98}O_{12}$. The thus formed epitaxial layer was 50 μm thick and quite satisfactory in appearance. The lattice constant thereof was 1.2508 nm in approximate coincidence with that of the substrate NGG.

The half-value width ΔH of the peak in the microwave absorption spectrum of this epitaxial wafer was 1.7 Oe as determined in the above described manner.

EXAMPLE 5.

The experimental procedure was substantially the same as in Example 1 excepting the use of a single crystal wafer of a modified GGG expressed by the formula $Gd_{2.70}Ca_{0.32}Ga_{4.66}Zr_{0.32}O_{12}$ as the substrate and modification of the formulation of the oxide combination melted in the flux of boron oxide and lead oxide so as to obtain an epitaxial layer of the chemical composition of the formula $(Y_{0.68}Bi_{0.32})_{3.04}Fe_{4.96}O_{12}$. The thus formed epitaxial layer was 50 μm thick and quite satisfactory in appearance. The lattice constant thereof was 1.245 nm in approximate coincidence with that of the substrate NGG.

The half-value width ΔH of the peak in the microwave absorption spectrum of this epitaxial wafer was 1.3 Oe as determined in the above described manner.

EXAMPLE 6.

The experimental procedure was substantially the same as in Example 1 excepting the use of a single crystal wafer of a modified GGG expressed by the formula $Gd_{2.70}Ca_{0.35}Ga_{4.00}Mg_{0.30}Zr_{0.65}O_{12}$ as the substrate and modification of the formulation of the oxide combination melted in the flux of boron oxide and lead oxide. Three epitaxial wafers having epitaxial layers of different compositions were prepared in this manner. All of the epitaxial wafers each had a 50 μm thick epitaxial layer and were quite satisfactory in appearance without cracks and fissures. The chemical compositions and lattice constants of these epitaxial layers were as shown below. The lattice constants were approximately in coincidence with that of the substrate single crystal within ±0.0005 nm of deviation.

$(Y_{0.66}La_{0.34})_{3.02}Fe_{4.98}O_{12}$: lattice constant 1.2501 nm $(Y_{0.49}Bi_{0.51})_{3.02}Fe_{4.98}O_{12}$: lattice constant 1.2499 nm $(Y_{0.31}Gd_{0.30}Bi_{0.39})_{3.03}Fe_{4.97}O_{12}$: lattice constant 1.2500 nm The half-value width ΔH of the peak in the microwave absorption spectrum was smaller than 1.5 Oe in each of these epitaxial wafers as determined in the above described manner.

EXAMPLE 7.

The experimental procedure using a single crystal wafer of GGG as the substrate was substantially the same as in Example 1 excepting modification of the formulation of the oxide combination melted in the flux of boron oxide and lead oxide. Five epitaxial wafers having epitaxial layers of different compositions were prepared in this manner. All of the epitaxial wafers each had a 50 μm thick epitaxial layer and were quite satisfactory in appearance without cracks and fissures. The chemical compositions and lattice constants of these epitaxial layers were as shown below. The lattice constants were approximately in coincidence with that of the substrate single crystal within ±0.0003 nm of deviation.

$(Y_{0.90}La_{0.10})_{3.03}(Fe_{0.85}Al_{0.15})_{4.97}O_{12}$: lattice constant 1.2382 nm $(Y_{0.96}La_{0.04})_{3.04}(Fe_{0.83}Ga_{0.17})_{4.96}O_{12}$: lattice constant 1.2385 nm $(Y_{0.84}Bi_{0.16})_{3.03}(Fe_{0.84}Al_{0.16})_{4.97}O_{12}$: lattice constant 1.2384 nm $(Y_{0.93}Bi_{0.07})_{3.04}(Fe_{0.82}Ga_{0.18})_{4.96}O_{12}$: lattice constant 1.2383 nm $(Y_{0.83}Gd_{0.17})_{3.04}(Fe_{0.84}Ga_{0.16})_{4.96}O_{12}$: lattice constant 1.2385 nm The half-value width ΔH of the peak in the microwave absorption spectrum was smaller than 1.0 Oe in each of these epitaxial wafers as determined in the above described manner.

EXAMPLE 8.

Figure 2:
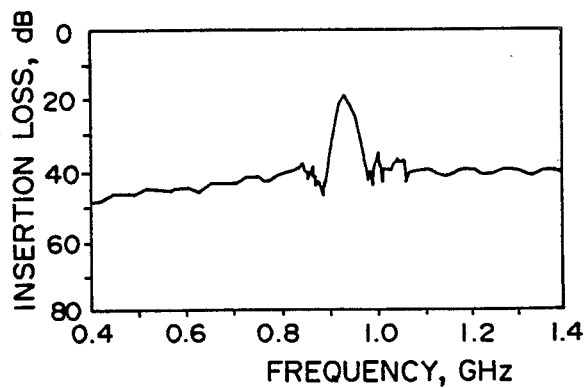
FIG. 2 is a graph showing the performance characteristic of the high-frequency tunable filter of FIGS. 1a and 1b as a function of the frequency and FIG. 3 is a graph showing the temperature dependency of the same.

One of the epitaxial wafers prepared in Examples 1 to 7 was used as a working element for constructing a high-frequency tunable filter as illustrated in FIGS. 1a and 1b using magnetostatic forward volume waves (MSFVW) propagating the epitaxial layer. The aluminum electrodes for excitation and detection of the MSFVW were formed by the techniques of photolithography. FIG. 2 is a graph showing the insertion loss as a frequency characteristic of the high-frequency tunable filter constructed with the epitaxial wafer prepared in Example 1. The trend of the frequency characteristic was substantially the same when the high-frequency tunable filter was constructed with the epitaxial wafer prepared in other Examples than Example 1. The center frequency of the high-frequency tunable filter could be varied by controlling the electric current in the frequency-controlling coil.

The temperature dependency coefficient (TCF) of the center frequency of the thus constructed high-frequency tunable filter was determined from the values $f_{(60° C.)}$, $f_{(20° C.)}$ and $f_{(-20° C.)}$ of the frequency at 60° C., 20° C. and −20° C., respectively, by using the equation $$TCF = [f_{(60° C.)} - f_{(-20° C.)}]/[f_{(20° C.)} \times 80]$$

to give the results shown by the curve A in FIG. 3. The external magnetic field in these experiments was produced by using an apparatus capable of producing a constant magnetic field irrespective of the ambient temperature. For comparison, the same experiments for the determination of TCF were conducted for a high-frequency tunable filter constructed by using a conventional epitaxial wafer with a YIG epitaxial layer on a GGG single crystal wafer to give the results shown by the curve B in FIG. 3. As is clear from this figure, the TCF of the high-frequency tunable filter according to the invention is much smaller than that of the conventional one over the whole frequency range tested.

EXAMPLE 9.

Figure 5:
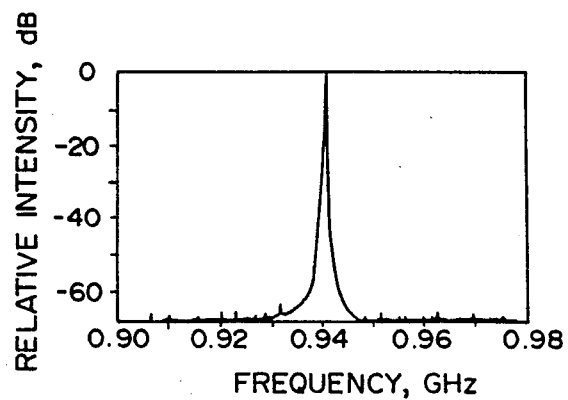

A high-frequency tunable oscillator as illustrated in FIG. 4 was constructed by using the high-frequency tunable filter of Example 1 constructed with the epitaxial wafer obtained in Example 1. FIG. 5 shows the high-frequency oscillation spectrum of this oscillator. The spectrum was substantially the same as in FIG. 5 when the oscillator was constructed by using any one of the other high-frequency tunable filters prepared by using the epitaxial waffers obtained in Example 1. The output frequency of these oscillators could be varied in a range from 0.3 to 10 GHz by controlling the electric current in the frequency-controlling coil.

Temperature dependency coefficient TCF of the output frequency of these high-frequency tunable oscillators was determined from the frequency values of $f_{(60° C.)}$, $f_{(20° C.)}$ and $f_{(-20° C.)}$ of the frequency at 60° C., 20° C. and −20° C., respectively, by using the equation $$TCF = [f_{(60° C.)} - f_{(-20° C.)}]/[f_{(20° C.)} \times 80]$$

to give a result which gave substantially the same characteristic curve as the curve A in FIG. 3. The external magnetic field in these experiments was produced by using an apparatus capable of producing a constant magnetic field irrespective of the ambient temperature. For comparison, the same experiments for the determination of TCF were conducted for a high-frequency tunable oscillator constructed by using a conventional epitaxial wafer with a YIG epitaxial layer on a GGG single crystal wafer to give the results shown by the curve B in FIG. 3. As is clear from this figure, the TCF of the high-frequency tunable oscillator according to the invention is much smaller than that of the conventional one over the whole frequency range tested.

What is claimed is:

1. An epitaxial single crystal wafer which comprises:
   (a) a single crystal wafer of a rare earth gallium garnet as a substrate wafer; and
   (b) an epitaxial layer of a magnetic single crystal having a thickness of at least 10 μm on at least one surface of the substrate wafer and represented by the chemical formula $(Y_{1-x}M_x)_a Fe_{8-a}O_{12}$, in which M is an element selected from the group consisting of bismuth, lanthanum, gadolinium and lutetium, the subscript a is a positive number in the range from 3.0 to 3.1 and the subscript x is a positive number in the range from 0.01 to 0.9.

2. The epitaxial single crystal wafer as claimed in claim 1 in which the rare earth gallium garnet as the substrate wafer is gadolinium gallium garnet.

3. The epitaxial single crystal wafer as claimed in claim 2 in which the value of x does not exceed 0.3.

4. The epitaxial single crystal wafer as claimed in claim 2 in which the epitaxial layer of a magnetic single crystal has a chemical composition expressed by the formula $(Y_{1-x}La_x)_a Fe_{8-a}O_{12}$, in which x is a positive number in the range from 0.01 to 0.02 and a is a positive number in the range from 3.01 to 3.04.

5. The epitaxial single crystal wafer as claimed in claim 2 in which the epitaxial layer of a magnetic single crystal has a chemical composition expressed by the formula $(Y_{1-x}Bi_x)_a Fe_{8-a}O_{12}$, in which x is a positive number in the range from 0.01 to 0.03 and a is a positive number in the range from 3.01 to 3.04.

6. The epitaxial single crystal wafer as claimed in claim 2 in which the epitaxial layer of a magnetic single crystal has a chemical composition expressed by the formula $(Y_{1-x}Gd_x)_a Fe_{8-a}O_{12}$, in which x is a positive number in the range from 0.07 to 0.09 and a is a positive number in the range from 3.02 to 3.05.

7. The epitaxial single crystal wafer as claimed in claim 2 in which the epitaxial layer of a magnetic single crystal has a chemical composition expressed by the formula $(Y_{1-x-y}Bi_xLu_y)_a Fe_{8-a}O_{12}$, in which x is a positive number smaller than 0.095 and y is a positive number smaller than 0.2 with the proviso that $x = 0.4y + 0.15$ and a is a positive number in the range from 3.01 to 3.05.

8. The epitaxial single crystal wafer as claimed in claim 1 in which the rare earth gallium garnet as the substrate wafer is neodrymium gallium garnet.

9. The epitaxial single crystal wafer as claimed in claim 1 in which the rare earth gallium garnet as the substrate wafer is samarium gallium garnet.

10. The epitaxial single crystal wafer as claimed in claim 9 in which the value of x is in the range from 0.1 to 0.8.

11. The epitaxial single crystal wafer as claimed in claim 1 in which the rare earth gallium garnet as the substrate wafer is a modified gadolinium gallium garnet having a chemical composition expressed by the formula $Gd_A Ca_B Ga_C Zr_B O_{12}$, in which $2.60 \leq A \leq 2.80$, $0.22 \leq B \leq 0.42$ and $4.56 \leq C \leq 4.76$ with the proviso that $A + 2B + C = 8$.

12. The epitaxial single crystal wafer as claimed in claim 1 in which the rare earth gallium garnet as the substrate wafer is a modified gadolinium gallium garnet having a chemical composition expressed by the formula $Gd_E Ca_F Ga_G Mg_H Zr_I O_{12}$, in which $2.60 \leq E \leq 2.80$, $0.25 \leq F \leq 0.45$, $3.90 \leq G \leq 4.10$ and $0.20 \leq H \leq 0.40$ and $0.55 \leq I \leq 0.75$ with the proviso that $E + F + G + H + I = 8$ and $F + H = I$.

13. A tunable filter for magnetostatic waves comprising an epitaxial single crystal wafer according to claim 1 provided on the surface of the epitaxial layer with an exciting electrode and a detecting electrode for magnetostiatic waves and held in an external magnetic field in such a disposition that the plane of the epitaxial layer is perpendicular to the direction of the magnetic field.

14. A tunable filter for magnetostiatic waves comprising an epitaxial single crystal wafer according to claim 5 provided on the surface of the epitaxial layer with an exciting electrode and a detecting electrode for magnetostiatic waves and held in an external magnetic field in such a disposition that the plane of the epitaxial layer is perpendicular to the direction of the magnetic field.

15. An oscillator for magnetostatic waves which comprises a tunable filter according to claim 13 and an amplifier connected in series to the tunable filter.

16. An epitaxial single crystal wafer which comprises:
  (a) a single crystal wafer of gadolinium gallium garnet as a substrate wafer; and
  (b) an epitaxial layer of a magnetic single crystal having a thickness of at least 10 μm on at least one surface of the substrate wafer and represented by the chemical formula

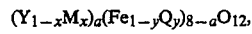

in which M is an element selected from the group consisting of bismuth, lanthanum, gadolinium and lutetium, the subscript a is a positive number in the range from 3.0 to 3.1, the subscript x is a positive number in the range from 0.01 to 0.9, Q is an element selected from the group ocnsisting of aluminum, gallium, indium and scandium and the subscript y is a positive number in the range from 0.1 to 0.2.

17. The epitaxial single crystal wafer as claimed in claim 16 in which the epitaxial layer of a magnetic single crystal has a chemical composition expressed by the formula

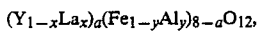

in which x is a positive number in the range from 0.08 to 0.12, y is a positive number in the range from 0.13 to 0.17 and a is a positive number in the range from 3.00 to 3.04.

18. The epitaxial single crystal wafer as claimed in claim 16 in which the epitaxial layer of a magnetic single crystal has a chemical composition expressed by the formula

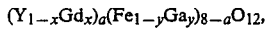

in which x is a positive number in the range from 0.15 to 0.19, y is a positive number in the range from 0.14 to 0.18 and a is a positive number in the range from 3.01 to 3.05.

19. A tunable filter for magnetostatic waves comprising an epitacial single crystal wafer according to claim 16 provided on the surface of the epitaxial layer with an exciting electrode and a detecting electrode for magnetostiatic waves and held in an external magnetic field in such a disposition that the plane of the epitaxial layer is perpendicular to the direction of the magnetic field.

20. An oscillator for magnetostatic waves which comprises a tunable filter according to claim 19 and an amplifier connected in series to the tunable filter.

* * * * *